(12) United States Patent
Wang

(10) Patent No.: US 10,873,049 B2
(45) Date of Patent: Dec. 22, 2020

(54) ORGANIC LIGHT-EMITTING DEVICE AND PREPARATION METHOD THEREOF, DISPLAY APPARATUS

(71) Applicant: BOE TECHNOLOGY GROUP CO., LTD., Beijing (CN)

(72) Inventor: Wei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 39 days.

(21) Appl. No.: 16/080,142

(22) PCT Filed: Jan. 16, 2018

(86) PCT No.: PCT/CN2018/072778
§ 371 (c)(1),
(2) Date: Aug. 27, 2018

(87) PCT Pub. No.: WO2018/209994
PCT Pub. Date: Nov. 22, 2018

(65) Prior Publication Data
US 2019/0379003 A1    Dec. 12, 2019

(30) Foreign Application Priority Data
May 15, 2017   (CN) .......................... 2017 1 0338554

(51) Int. Cl.
| | | |
|---|---|---|
| *H01L 51/50* | (2006.01) | |
| *H01L 51/52* | (2006.01) | |
| *H01L 51/56* | (2006.01) | |

(52) U.S. Cl.
CPC ........ *H01L 51/5036* (2013.01); *H01L 51/524* (2013.01); *H01L 51/5253* (2013.01); *H01L 51/5262* (2013.01); *H01L 51/56* (2013.01)

(58) Field of Classification Search
CPC ............. H01L 51/5036; H01L 51/5262; H01L 51/5253; H01L 51/524; H01L 51/5246; H01L 51/525
See application file for complete search history.

(56) References Cited

U.S. PATENT DOCUMENTS

| | | | |
|---|---|---|---|
| 7,037,601 B2 | 5/2006 | Hatwar | |
| 2004/0046184 A1* | 3/2004 | Yanagawa | ............. H01L 27/322 257/200 |

(Continued)

FOREIGN PATENT DOCUMENTS

| | | |
|---|---|---|
| CN | 201114861 Y | 9/2008 |
| CN | 101807654 A | 8/2010 |

(Continued)

OTHER PUBLICATIONS

First Chinese Office Action dated Feb. 24, 2018.

(Continued)

*Primary Examiner* — Quoc D Hoang
(74) *Attorney, Agent, or Firm* — Dilworth & Barrese, LLP.; Michael J. Musella, Esq.

(57) ABSTRACT

An organic light-emitting device and preparation method thereof, and a display apparatus are provided. The organic light-emitting device includes: a base substrate, an organic light-emitting element provided on the base substrate and an encapsulation structure for encapsulating the organic light-emitting element. The encapsulation structure includes a fluorescent material, and the organic light-emitting element emits a first light, and the fluorescent material is excited by the first light to generate a second light.

14 Claims, 4 Drawing Sheets

(56) References Cited

U.S. PATENT DOCUMENTS

| | | | | |
|---|---|---|---|---|
| 2006/0099449 A1* | 5/2006 | Amano | ............. | C09K 11/7789 |
| | | | | 428/690 |
| 2010/0052504 A1* | 3/2010 | Sato | ...................... | C09K 11/02 |
| | | | | 313/483 |
| 2012/0043555 A1* | 2/2012 | Tuan | ..................... | C09K 11/06 |
| | | | | 257/76 |
| 2014/0374696 A1 | 12/2014 | Liu et al. | | |

FOREIGN PATENT DOCUMENTS

| | | | |
|---|---|---|---|
| CN | 103258965 A | 8/2013 | |
| CN | 103346266 A | 10/2013 | |
| CN | 104993037 A | 10/2015 | |
| CN | 105226159 A | 1/2016 | |
| CN | 106953027 A | 7/2017 | |
| DE | 102007049005 A1 | 3/2009 | |
| JP | 2009026649 A | 2/2009 | |
| TW | I338032 B | 3/2011 | |

OTHER PUBLICATIONS

Third Chinese Office Action dated Jan. 7, 2019.
International Search Report and Written Opinion dated Apr. 12, 2018 from State Intellectual Property Office of the P.R. China.

\* cited by examiner

ORGANIC LIGHT-EMITTING DEVICE AND PREPARATION METHOD THEREOF, DISPLAY APPARATUS

The application claims priority to the Chinese patent application No. 201710338554.6, filed on May 15, 2017, the entire disclosure of which is incorporated herein by reference as part of the present application.

TECHNICAL FIELD

Embodiments of the present disclosure relate to an organic light-emitting device and a preparation method thereof, and a display apparatus.

BACKGROUND

Organic electroluminescent devices are considered to have a great application prospect due to advantages of self-luminescence, solid state, wide viewing angle, fast response and the like. Nowadays, organic electroluminescent devices emitting white light have attracted much attention. For example, the white light is achieved by mixing sky blue light and yellow orange light (two bands manner) or by mixing red light, green light and blue light (three bands manner). In this case, for example, it is required to mix several kinds of luminescent materials. Because it is difficult to control the mixing ratio, the production process is complex and the production cost is high.

SUMMARY

Embodiments of the present disclosure provide an organic light-emitting device. The organic light-emitting device includes: a base substrate, an organic light-emitting element provided on the base substrate and an encapsulation structure for encapsulating the organic light-emitting element. The encapsulation structure comprises a fluorescent material, and the organic light-emitting element emits a first light, and the fluorescent material is excited by the first light to generate a second light.

For example, compound light of the first light and the second light is white light.

For example, the fluorescent material includes a first fluorescent material and a second fluorescent material, and the first fluorescent material and the second fluorescent material are excited by the first light to respectively generate the second light and a third light.

For example, compound light of the first light, the second light and the third light is white light.

For example, the first light is monochromatic light in a visible spectrum.

For example, the encapsulation structure includes an inorganic protection layer and an organic protection layer, and the organic protection layer includes the fluorescent material.

For example, the fluorescent material includes a first fluorescent material and a second fluorescent material; the first fluorescent material and the second fluorescent material are excited by the first light to respectively generate the second light and a third light, and the first fluorescent material and the second fluorescent material are included in the organic protection layer and mix with each other.

For example, the first fluorescent material includes a first fluorescent material and a second fluorescent material; the first fluorescent material and the second fluorescent material are excited by the first light to respectively generate the second light and a third light; the organic protection layer includes a first organic protection layer and a second organic protection layer, which are stacked, the first organic protection layer includes the first fluorescent material, and the second organic protection layer includes the second fluorescent material.

For example, a wavelength of the second light generated by the first fluorescent material being excited by the first light is longer than a wavelength of the third light generated by the second fluorescent material being excited by the first light, and the first organic protection layer including the first fluorescent material is provided to be closer to the organic light-emitting element than the second organic protection layer including the second fluorescent material.

For example, the encapsulation structure includes two of the inorganic protection layers which are stacked, and the organic protection layer is provided between the two inorganic protection layers.

For example, the encapsulation structure comprises a cover plate and a filling layer filled between the cover plate and the organic light-emitting element, and the filling layer comprises the fluorescent material.

For example, the encapsulation structure further comprises an inorganic protection layer provided between the filling layer and the organic light-emitting device.

For example, the organic light-emitting device includes a luminous area and a non-luminous area outside the luminous area. The organic light-emitting element is in the luminous area, and the encapsulation structure comprises a portion in the luminous area and a portion in the non-luminous area, and the fluorescent material included in the encapsulation structure is only uniformly distributed in the portion, which is in the luminous area, of the encapsulation structure.

For example, the organic light-emitting element comprises a first electrode layer, a second electrode layer and a light-emitting layer between the first electrode layer and the second electrode layer; the first electrode layer or the second electrode layer, which is between the light-emitting layer and the encapsulation structure, is transparent.

Embodiments of the present disclosure provide a display apparatus. The display apparatus includes the organic light-emitting device mentioned above.

Embodiments of the present disclosure provide a preparation method of an organic light-emitting device. The preparation method includes: providing a base substrate; forming an organic light-emitting element on the base substrate, the organic light-emitting element emitting a first light; encapsulating the organic light-emitting element by using an encapsulation structure. The encapsulation structure comprises a fluorescent material, and the fluorescent material is excited by the first light to generate a second light.

For example, the method further includes: selecting a light-emitting material for forming the organic light-emitting element and the fluorescent material included in the encapsulation structure so that compound light of the first light and the second light is white light.

For example, the encapsulation structure comprises an inorganic protection layer and an organic protection layer. The encapsulating the organic light-emitting element by using the encapsulation structure comprises: forming the inorganic protection layer; and doping the fluorescent material in an organic protection material for forming the organic protection layer, and forming the organic protection layer by inkjet printing the organic protection material doped with the fluorescent material.

For example, the method further includes: adjusting a chromaticity of compound light of the first light and the second light by at least one of: adjusting a concentration of the fluorescent material; and adjusting a thickness of the organic protection layer.

For example, the encapsulation structure comprises a cover plate and a filling layer filled between the cover plate and the organic light-emitting element. The encapsulating the organic light-emitting element by using the encapsulation structure comprises: coating a sealant material at edges of the cover plate, mixing the fluorescent material with a desiccant, and coating the fluorescent material and the desiccant mixed with each other on the cover plate inside the sealant material; bonding the cover plate with the base substrate; and solidifying the sealant material and the desiccant to form a sealant and the filling layer.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 2 (*b*) is a top view of the organic light-emitting device provided by the embodiments of the present disclosure;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
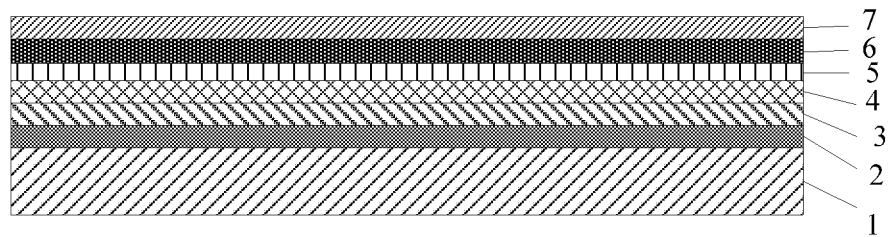
FIG. 1 is a structural schematic diagram of an organic electroluminescent device according to one technique.

FIG. 1 illustrates an organic electroluminescent device emitting white light according to one technique, and the organic electroluminescent device includes: a base substrate 1, an anode layer 2, a hole transport layer 3, a first light-emitting layer 4, a second light-emitting layer 5, an electron transport layer 6 and a cathode layer 7.

For example, a suitable voltage is applied to the device shown in FIG. 1, holes and electrons recombine with each other in the first light-emitting layer 4 and the second light-emitting layer 5 so that light is emitted. For example, the first light-emitting layer 4 emits sky blue light, the second light-emitting layer 5 emits yellow orange light, and the sky blue light and the yellow orange light combine into the white light. For the light-emitting device illustrated in FIG. 1, it is necessary to manufacture the first light-emitting layers 4 and the second light-emitting layer 5 which are different from each other, and a manufacturing process of the light-emitting device is complex and a production cost of the light-emitting device is high.

According to the embodiments of the present disclosure, a fluorescent material is added in an encapsulation structure of an organic light-emitting element, light emitted by the organic light-emitting element excites the fluorescent material in the encapsulation structure to emit another light, the light emitted by the organic light-emitting element and the light emitted by the fluorescent material being excited combine into white light. It should be noted that, in addition to the white light, light of other colors is also achieved as required in the embodiments of the present disclosure. The exemplary embodiments of the present disclosure are described in detail in the following.

Figure 2:
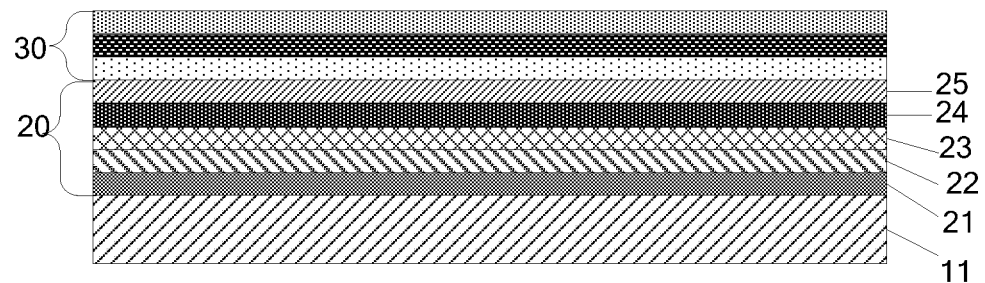
FIG. 2 (*a*) is a structural schematic diagram of an organic light-emitting device provided by embodiments of the present disclosure.
Figure 2:
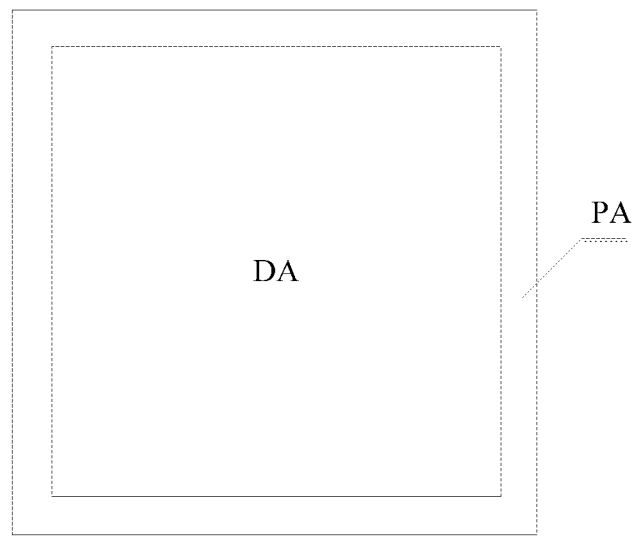

As illustrated in FIG. 2 (*a*), the embodiments of the present disclosure provide the organic light-emitting device, and the organic light-emitting device includes: a base substrate 11, an organic light-emitting element 20 provided on the base substrate 11 and an encapsulation structure 30 for encapsulating the organic light-emitting element 20. The encapsulation structure 30 includes the fluorescent material, the organic light-emitting element 20 emits a first light, and the fluorescent material is excited by the first light to generate a second light. For example, the encapsulation structure 30 is provided at a light output side of the organic light-emitting element 20.

For example, as illustrated in FIG. 2 (*b*), the organic light-emitting device includes a luminous area DA and a non-luminous area PA outside the luminous area DA. For example, the organic light-emitting element 20 is in the luminous area DA. For example, the encapsulation structure 30 includes a portion in the luminous area DA and a portion in the non-luminous area PA. For example, the fluorescent material included in the encapsulation structure 30 is only uniformly distributed in the portion, which is in the luminous area DA, of the encapsulation structure 30. For example, circuits and the like configured to drive the light-emitting element are provided in the non-luminous area PA.

For example, the base substrate 11 is a transparent glass substrate or a transparent plastic substrate.

For example, a wavelength of the first light is different from a wavelength of the second light. For example, compound light of the first light and the second light is the white light. For example, the first light is green light, blue light, yellow light or red light. For example, the second light is crystal red light, yellow light or cyan light, etc. Thus, the blue light and the yellow light mix into the white light; the green light and the crystal red light mix into the white light; and the red light and the cyan light mix into the white light. What described above are just examples, the white light may be achieved by mixing light of other two different colors as required. Of course, the first light and the second light may be light of other colors so as to mix with each other to obtain light except the white light as required.

For example, the fluorescent material includes a first fluorescent material and a second fluorescent material, and the first fluorescent material and the second fluorescent material are excited by the first light to respectively generate the second light and a third light. For example, compound light of the first light, the second light and the third light is the white light. For example, the first light is blue light, the second light is green light, and the third light is red light. Thus, the blue light, the green light and the red light mix into the white light. What described above are just examples, the white light may be achieved by mixing light of other three colors as required. Of course, the first light, the second light and the third light may be light of other colors so as to mix with each other to obtain light except the white light as required.

For example, the organic light-emitting element emit only the first light. For example, the first light emitted by the organic light-emitting element 20 is monochromatic light (the monochromatic light cannot be decomposed into other colors of light) in a visible spectrum, for example, red light, orange light, yellow light, green light, cyan light or purple light. The white light is compound light and does not belong to the monochromatic light in the visible spectrum, and therefore the first light emitted by the organic light-emitting element is not the white light.

For example, the organic light-emitting element 20 is an organic electroluminescent element or an organic photoluminescence element.

For example, as illustrated in FIG. 2 (a), the organic light-emitting element 20 includes a first electrode layer 21, a second electrode layer 25 and a light-emitting layer 23 between the first electrode layer 21 and the second electrode layer 25. The first light emitted by the organic light-emitting element 20 is monochromatic light, that is, the first light is emitted by the light-emitting layer 23 and the first light is monochromatic light. In this case, there is no need to arrange a plurality of different light-emitting layers which are stacked, and there is no need for multiple doping of the light-emitting layer, that is, the light-emitting layer is a single layer structure, which can simplify a structure of the light-emitting layer 23 and reduce a production cost of the organic light-emitting device.

As described above, the encapsulation structure 30 is provided at the light output side of the organic light-emitting element 20. Therefore, the first electrode layer 21 or the second electrode layer 25, which is between the light-emitting layer 23 and the encapsulation structure 30, is transparent. For example, in FIG. 2(a), the second electrode layer 25 is transparent, so that the first light emitted by the light-emitting layer 23 is irradiated to the encapsulation structure 30 through the second electrode layer 25.

In the following, the organic light-emitting element 20 included in the organic light-emitting device in the embodiments of the present disclosure is further described, by taking an example that the organic light-emitting element 20 is the organic electroluminescent element.

For example, as illustrated in FIG. 2 (a), the organic electroluminescent element 20 includes: an anode layer 21 (that is, the first electrode layer mentioned above), a hole transport layer 22, the organic light-emitting layer 23, an electron transport layer 24 and a cathode layer 25 (that is, the second electrode layer mentioned above). The organic light-emitting layer 23 produces the first light after being excited. For example, the first light is the monochromatic light in the visible spectrum. The organic light-emitting layer 23 only produces the monochromatic light rather than the compound light, so that the organic light-emitting layer 23 is relatively easy to be achieved.

For example, the organic electroluminescent element 20 further includes: a hole injection layer between the anode layer 21 and the hole transport layer 22, and an electron injection layer between the electron transport layer 24 and the cathode layer 25. For example, the organic electroluminescent element 20 only includes the anode layer 21, the organic light-emitting layer 23 and the cathode layer 25. For example, the organic electroluminescent element 20 only includes the anode layer 21, the hole transport layer 22, the organic light-emitting layer 23 and the cathode layer 25.

For example, a material of the organic light-emitting layer 23 is selected according to the color of the first light emitted by the organic light-emitting layer 23. For example, a doping system is used, that is, a main light-emitting material is doped with a dopant material to obtain the light-emitting material. For example, the main light-emitting material includes a metal compound material, an anthracene derivative, an aromatic diamine compound, a triphenylamine compound, an aromatic triamine compound, a biphenylenediamine derivative compound, or a triarylamine polymer, etc. For example, the main light-emitting material includes bis (2-methyl-8-hydroxyquinoline-N1, O8)-(1,1'-biphenyl-4-hydroxyl) aluminum (Balq), 9, 10-two-(2-naphthalene) anthracene (ADN), TAZ, 4,4'-two (9-carbazole) biphenyl (CBP), MCP,4,4',4"-three-9-carbazole base three aniline (TCTA), N, N-bis (alpha naphthyl phenyl)-4 or 4-biphenyl two amine (NPB), etc. In a case the organic light-emitting layer 23 emits fluorescent light, the dopant material, for example, includes a coumarin dye (coumarin 6, C-545T), quinacridone (DMQA), or a series of 4-(dinitrile methylene)-2-methyl-6-(4-dimethylamino-styrene)-4H-pyran (DCM), etc. In a case where the organic light-emitting layer 23 emits phosphorescent light, the dopant material, for example, includes luminescent metal complexes based on Ir, Pt, Ru, Os, etc., for example, FIrpic, Fir6, FirN4, FIrtaz, Ir(ppy)3. Ir(ppy)2(acac), PtOEP, (btp)2Iracac, Ir(piq)2(acac) or (MDQ)2Iracac, etc. For example, a material of the organic light-emitting layer 23 includes double main light-emitting materials and the dopant material. For example, the light-emitting layer 23 emitting red light is made of 4,4'-bis (N-carbazole)-1,1'-biphenyl doped 5, 6, 11, 12-four phenyl and four benzene. For example, the light-emitting layer 23 emitting green light is made of 1, 3, 5-three (bromomethyl) benzene doped N, N dimethyl quinacridine. For example, the light-emitting layer 23 emitting blue light is made of 3-tert butyl-9, 10-two (2-naphthalene) anthracene doped with 2,5,8,11-tert butyl perylene.

The fluorescent material included in the encapsulation structure 30 is selected according to the color of the second light and the color of the third light. For example, the fluorescent material includes an up-conversion luminescent material or a down-conversion luminescent material. For example, up-conversion luminescence occurs in compounds doped with rare earth ions, and the up-conversion luminescent material includes fluorides, oxides, sulfur compounds, fluoride oxides, halides, etc. For example, in a case where it is required that the fluorescent material emits green light, the fluorescent material mainly includes NaYF4: Er, Yb, that is, the fluorescent material is double doped with ytterbium and erbium, Er is used as an activator, Yb is used as a sensitizer. For example, in a case where it is required that the fluorescent material emits blue light, the fluorescent material includes NaGdF4 in which Tm is used as an activator.

The position of the fluorescent material in the encapsulation structure 30 is related to the encapsulation method. For example, an encapsulation method of the organic light-emitting element includes a method of thin film encapsulation (TFE), a method of substrate encapsulation, etc. For example, in a case where the method of TFE is adopted, the fluorescent material is doped in an organic protection layer. For example, in a case where the method of substrate encapsulation is adopted, the fluorescent material is doped in a filling layer. Of course, the encapsulation method is not limited to be the above two encapsulation methods in the embodiments of the present disclosure, and other encapsulation methods adopted for encapsulating the organic light-emitting element also are applicable to the technical solution of the embodiments of the present disclosure.

Figure 3:
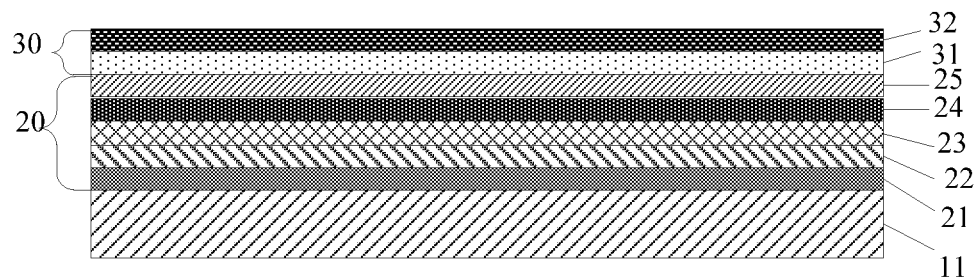
FIG. 3 (*a*)-FIG. 3 (*c*) are respectively structural schematic diagrams of the organic light-emitting device provided by the embodiments of the present disclosure, in which an organic light-emitting element encapsulated by a method of TFE is illustrated.
Figure 3:
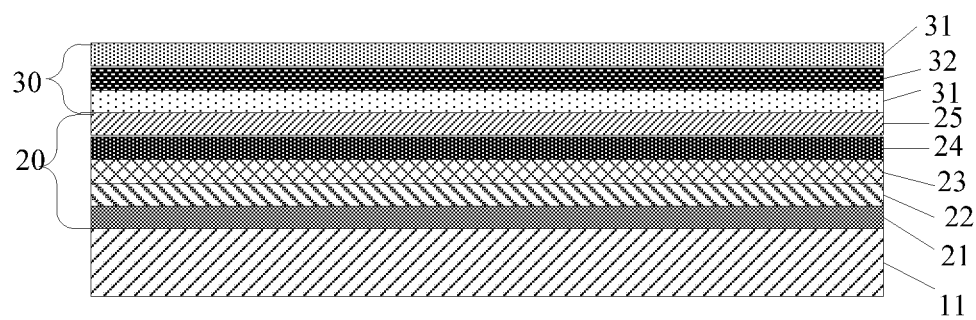
Figure 3:
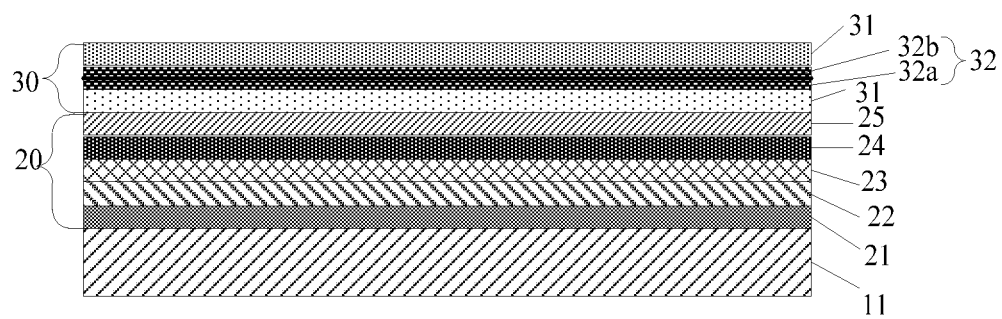

For example, as illustrated in FIGS. 3 (a)-3 (c), the method of TFE is adopted to encapsulate the organic light-emitting element 20.

For example, as illustrated in FIG. 3 (a), the encapsulation structure 30 includes an inorganic protection layer 31 and an organic protection layer 32, and the organic protection layer 32 includes the fluorescent material. For example, as illustrated in FIG. 3 (a), the inorganic protection layer 31 is between the organic protection layer 32 and the organic light-emitting element 20. However, limitations are not imposed to this case in the embodiments of the present disclosure. For example, the organic protection layer 32 is between the inorganic protection layer 31 and the organic light-emitting element 20; in this case, an ability of blocking external water and oxygen of the encapsulation structure 30 is further improved, because an ability of blocking external water and oxygen of the inorganic protection layer 31 is stronger than that of the organic protection layer 32.

For example, the fluorescent material is uniformly mixed with a material of the organic protection layer 32.

For example, the fluorescent material includes the first fluorescent material and the second fluorescent material; the first fluorescent material and the second fluorescent material are excited by the first light to respectively generate the second light and the third light, and the first fluorescent material and the second fluorescent material are included in the organic protection layer and mix with each other.

Only one inorganic protection layer 31 and one organic protection layer 32 are illustrated in FIG. 3 (a). However, limitations are not imposed to this case in the embodiments of the present disclosure. For example, the encapsulation structure 30 includes a plurality of inorganic protection layers 31 and a plurality of organic protection layers 32, which are alternately arranged; in this case, the fluorescent material is included in one or several of the organic protection layers 32 or each of the organic protection layers 32.

For example, a material of the inorganic protection layer 31 includes silicon nitride (SiN), silicon carbonitride (SiCN), silicon oxide (SiO), aluminum oxide (ALxOy), etc. For example, the inorganic protection layer 31 is formed by a method of chemical vapor deposition (CVD) or atomic layer deposition (ALD), etc. For example, the organic protection layer 32 includes an organic protective material (for example, acrylic resin, etc.). For example, the organic protection layer 32 is formed by a method of inkjet printing.

For example, as illustrated in FIG. 3 (b), the encapsulation structure includes two inorganic protection layers 31 which are stacked, and the organic protection layer 32 is provided between the two inorganic protection layers 31, so that the ability of blocking external water and oxygen of the encapsulation structure 30 is further improved. For example, the encapsulation structure 30 includes a plurality of inorganic protection layers 31 and a plurality of organic protection layers 32, which are alternately arranged; in the encapsulation structure 30, both an outermost layer of and a layer directly contacting with the organic light-emitting element 20 are the inorganic protection layer 31, so that the ability of blocking external water and oxygen of the encapsulation structure 30 is further improved.

For example, as illustrated in FIG. 3 (c), the fluorescent material includes the first fluorescent material and the second fluorescent material; the first fluorescent material and the second fluorescent material are excited by the first light to respectively generate the second light and the third light; the organic protection layer 32 includes a first organic protection layer 32a and a second organic protection layer 32b, which are stacked, the first organic protection layer 32a includes the first fluorescent material, and the second organic protection layer 32b includes the second fluorescent material. For example, the first fluorescent material is uniformly mixed with a material of the first organic protection layer 32a. For example, the second fluorescent material is uniformly mixed with a material of the second organic protection layer 32b.

For example, as illustrated in FIG. 3 (c), the first organic protection layer 32a and the second organic protection layer 32b directly contact with each other. However, limitations are not imposed to this case in the embodiments of the present disclosure, for example, the inorganic protection layer 31 is provided between the first organic protection layer 32a and the second organic protection layer 32b.

For example, a wavelength of the second light generated by the first fluorescent material being excited by the first light is longer than a wavelength of the third light generated by the second fluorescent material being excited by the first light, and the first organic protection layer 32a including the first fluorescent material is provided to be closer to the organic light-emitting element than the second organic protection layer 32b including the second fluorescent material. In this way, it can avoided that the second fluorescent material produces light of other colors upon being excited by the second light, and it is beneficial to controlling a chromaticity of compound light of the first light, the second light and the third light.

Figure 4:
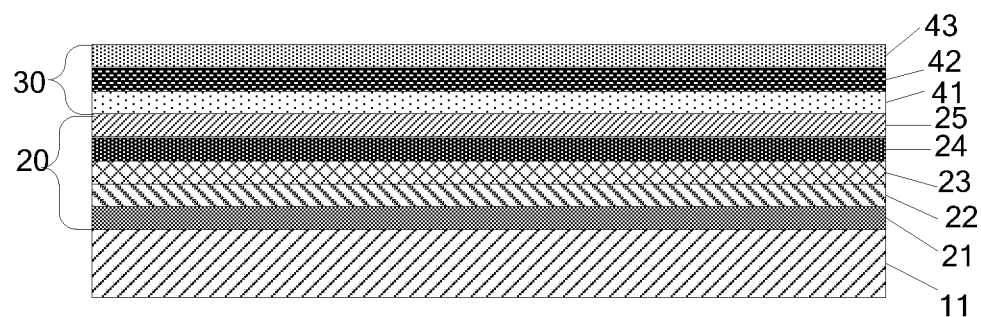
FIG. 4 is another structural schematic diagram of the organic light-emitting device provided by the embodiments of the present disclosure, in which the organic light-emitting element encapsulated by a method of substrate encapsulation is illustrated.

For example, as illustrated in FIG. 4, the organic light-emitting element 20 is encapsulated by the method of substrate encapsulation.

For example, as illustrated in FIG. 4, the encapsulation structure 30 includes a cover plate 43 and a filling layer 42 filled between the cover plate 43 and the organic light-emitting element 20, and the filling layer 42 includes the fluorescent material. For example, the fluorescent material is uniformly mixed with a material of the filling layer 42. For example, the material of the filling layer 42 includes a desiccant. For example, the cover plate 43 is a glass cover plate or a metal cover plate.

For example, as illustrated in FIG. 4, the encapsulation structure 30 further includes an inorganic protection layer 41 provided between the filling layer 42 and the organic light-emitting element 20. For example, a material of the inorganic protection layer 41 includes silicon nitride (SiN), silicon carbonitride (SiCN), silicon oxide (SiO), aluminum oxide (ALxOy), etc.

Compared with a case where the white light is produced by using a plurality of light-emitting layers or a case where the white light is produced by doping a plurality of luminescent materials, the organic light-emitting device provided by the embodiments of the present disclosure needs only one light-emitting layer 23 which emits monochromatic light and thus has advantages of simple structure, simple manufacturing process and low production cost. In addition, in the organic light-emitting device, for example, the fluorescent material included in the encapsulation structure only distributed in the portion, which is in the luminous area, of the encapsulation structure, so that an amount of use of the fluorescent material is reduced, and materials used are saved and the production cost is reduced. In addition, in a case where the white light is produced by using a plurality of light-emitting layers, controlling the proportions of the organic light-emitting layers are complex; however, in the organic light-emitting device according to the embodiments of the present disclosure, it is only necessary to control a concentration of the fluorescent material in the layer including the fluorescent material and a thickness of the layer including the fluorescent material, and the controlling is simple. In addition, the fluorescent material is included in the encapsulation structure, and the encapsulation process is not changed much. It is only required that the fluorescent material is doped in a material for forming the encapsulation structure, which is simple to be achieved.

The embodiments of the present disclosure further provide a display apparatus, and the display apparatus includes the organic light-emitting device mentioned above. For example, the display apparatus may include any products or components having display function as follows: a mobile phone, a panel computer, a TV set, a display, a laptop, a digital photo frame, a navigation instrument or the like.

Figure 5:
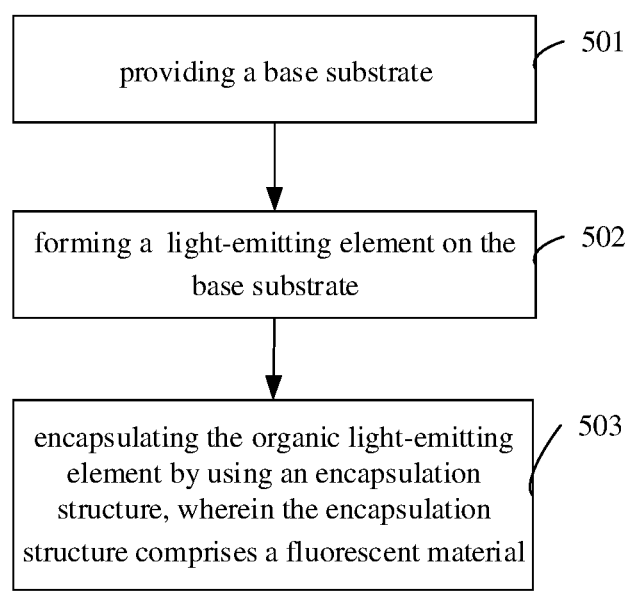
FIG. 5 is a flow-process diagram of a preparation method of an organic light-emitting device provided by the embodiments of the present disclosure.

For example, the embodiments of the present disclosure further provide a preparation method of an organic light-emitting device. For example, as illustrated in FIG. 5, the method includes:

Step 501, providing a base substrate 11;

For example, the base substrate 11 is a transparent glass substrate or a transparent plastic substrate.

Step 502, forming an organic light-emitting element 20 on the base substrate 11, and the organic light-emitting element 20 emits a first light;

Step 503, encapsulating the organic light-emitting element 20 using an encapsulation structure 30, and the encapsulation structure 30 includes a fluorescent material, and the fluorescent material is excited by the first light to generate a second light.

For example, the method further includes: selecting a light-emitting material for forming the organic light-emitting element 20 and the fluorescent material included in the encapsulation structure 30 so that compound light of the first light and the second light is white light. For example, the light-emitting material for forming the organic light-emitting element 20 is selected so that the first light is blue light; the fluorescent material is selected so that the second light is yellow light. What described above is just an example, other light-emitting material and fluorescent material may be selected as required, and thus light of other colors are emitted to combine into the white light.

In the embodiments of the present disclosure, the encapsulation structure 30 includes the fluorescent material. It is only required that the fluorescent material is mixed with a material for forming the encapsulation structure 30, and the encapsulation process is not changed much.

For example, the organic light-emitting element is encapsulated by a method of TFE, and the encapsulation structure 30 includes an inorganic protection layer 31 and an organic protection layer 32. In this case, encapsulating the organic light-emitting element 20 using the encapsulation structure 30 includes:

forming the inorganic protection layer 31, and doping the fluorescent material in an organic protection material for forming the organic protection layer 32, and forming the organic protection layer 32 for example by inkjet printing the organic protection material doped with the fluorescent material.

For example, a material of the inorganic protection layer 31 includes silicon nitride (SiN), silicon carbonitride (SiCN), silicon oxide (SiO), aluminum oxide (ALxOy), etc. For example, the inorganic protection layer 31 is formed by a method of deposition. For example, the inorganic protection layer 31 is formed by a method of chemical vapor deposition (CVD) or atomic layer deposition (ALD), etc. For example, the organic protection layer 32 includes a resin material, for example, acrylic resin, etc.

For example, the fluorescent material is uniformly doped in the organic protection material.

For example, the preparation method further includes: adjusting a chromaticity of the compound light of the first light and the second light by at least one of the following methods:

adjusting a concentration of the fluorescent material; and adjusting a thickness of the organic protection layer 32.

That is, the chromaticity of light emitted finally (the compound light of the first light and the second light) is changed by changing a percentage of the fluorescent material and a percentage of the organic protection material and changing an amount of the fluorescent material and an amount of the organic protection material.

Figure 6:
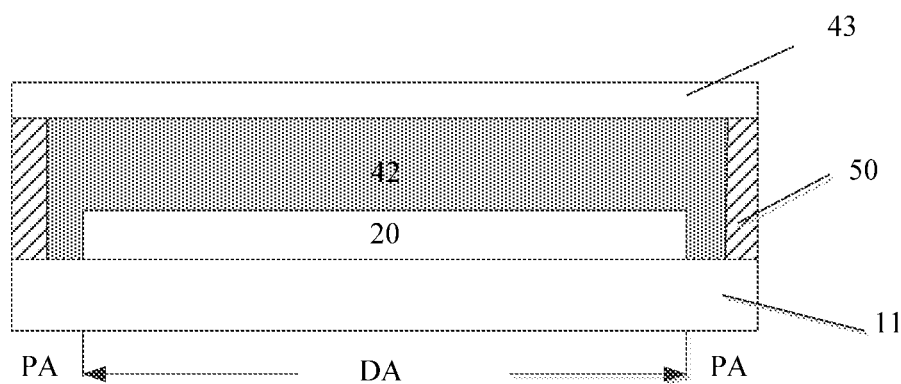
FIG. 6 (*a*) and FIG. 6 (*b*) are structural schematic diagrams of the organic light-emitting device provided by the embodiments of the present disclosure, in which a filling layer formed inside a sealant is illustrated.
Figure 6:
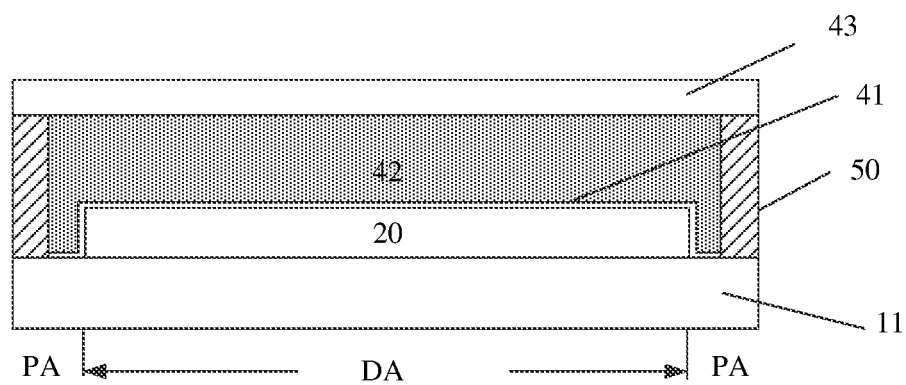

For example, the organic light-emitting element 20 is encapsulated by a method of substrate encapsulation, and the encapsulation structure 30 includes a cover plate 43 and a filling layer 42 filled between the cover plate 43 and the organic light-emitting element 20. In this case, encapsulating the organic light-emitting element 20 using the encapsulation structure 30 includes:

coating a sealant material at edges of the cover plate 43, mixing the fluorescent material with a desiccant, and coating the fluorescent material and the desiccant mixed with each other on the cover plate 43 inside the sealant material;

bonding the cover plate 43 with the base substrate 11, and solidifying the sealant material and the desiccant to form a sealant 50 and the filling layer 42, as illustrated in FIG. 6 (a).

For example, ultraviolet radiation is used to solidify the sealant material and the desiccant.

For example, the desiccant is UV-curable liquid desiccant.

For example, the fluorescent material is uniformly doped in the desiccant.

For example, in a case where the organic light-emitting element 20 is encapsulated by the method of substrate encapsulation, the encapsulation structure 30 further includes an inorganic protection layer 41 provided between the filling layer 42 and the organic light-emitting element 20. For example, as illustrated in FIG. 6 (b), the inorganic protection layer 41 is provided inside the sealant 50. If the inorganic protection layer 41 extend outside of the sealant 50, external water and oxygen may enter the organic light-emitting element 20 via an interface between the inorganic protection layer 41 and the sealant 50 and an interface between the inorganic protection layer 41 and the base substrate 11, so that an effect of encapsulation is affected.

For example, the chromaticity of light emitted finally (the compound light of the first light and the second light) is changed by changing the percentage of the fluorescent material and the percentage of the desiccant and changing the amount of the fluorescent material and the amount of the desiccant.

For example, forming the organic light-emitting element 20 on the base substrate includes: forming a first electrode layer, a light-emitting layer and a second electrode layer.

the following should be noted:

(1) only the structures involved in the embodiments of the present disclosure are illustrated in the drawings of the embodiments of the present disclosure, and other structures may refer to usual designs;

(2) in order to clearly illustrate, the thickness of each film in the drawings do not reflect the real scale, they may be amplified in the drawings of the embodiments of the present disclosure;

(3) the embodiments and features in different embodiments of the present disclosure may be combined in case of no conflict.

What have been described above are only specific implementations of the present disclosure, the protection scope of the present disclosure is not limited thereto. The protection scope of the present disclosure should be based on the protection scope of the claims.

What is claimed is:

1. An organic light-emitting device, comprising: a base substrate, an organic light-emitting element provided on the base substrate and an encapsulation structure for encapsulating the organic light-emitting element, wherein
   the encapsulation structure comprises a fluorescent material, and the organic light-emitting element emits a first light, and the fluorescent material is excited by the first light to generate a second light;
   the encapsulation structure comprises a cover plate and a filling layer filled between the cover plate and the organic light-emitting element, and the filling layer comprises the fluorescent material;
   the encapsulation structure further comprises an inorganic protection layer provided between the filling layer and the organic light-emitting element; and
   the organic light-emitting device further comprises a sealant between the cover plate and the base substrate, the sealant surrounds the organic light-emitting element, the filling layer and the inorganic protection layer, and an end of the inorganic protection layer contacts an inner wall, facing the organic light-emitting element, of the sealant.

2. The organic light-emitting device according to claim 1, wherein the first light is monochromatic light in a visible spectrum.

3. The organic light-emitting device according to claim 1, comprising a luminous area and a non-luminous area outside the luminous area, wherein the organic light-emitting element is in the luminous area, and the encapsulation structure comprises a portion in the luminous area and a portion in the non-luminous area, and the fluorescent material included in the encapsulation structure is only uniformly distributed in the portion, which is in the luminous area, of the encapsulation structure.

4. The organic light-emitting device according to claim 1, wherein the organic light-emitting element comprises a first electrode layer, a second electrode layer and a light-emitting layer between the first electrode layer and the second electrode layer; the first electrode layer or the second electrode layer, which is between the light-emitting layer and the encapsulation structure, is transparent.

5. A display apparatus, comprising the organic light-emitting device according to claim 1.

6. The organic light-emitting device according to claim 1, wherein compound light of the first light and the second light is white light.

7. The organic light-emitting device according to claim 1, wherein the fluorescent material comprises a first fluorescent material and a second fluorescent material, and the first fluorescent material and the second fluorescent material are excited by the first light to respectively generate the second light and a third light.

8. The organic light-emitting device according to claim 7, wherein compound light of the first light, the second light and the third light is white light.

9. A preparation method of an organic light-emitting device, comprising:
   providing a base substrate;
   forming an organic light-emitting element on the base substrate, wherein the organic light-emitting element emits a first light;
   encapsulating the organic light-emitting element by using an encapsulation structure, wherein the encapsulation structure comprises a fluorescent material, and the fluorescent material is excited by the first light to generate a second light, wherein
   the encapsulation structure comprises a cover plate and a filling layer filled between the cover plate and the organic light-emitting element; and
   the encapsulating the organic light-emitting element by using the encapsulation structure comprises:
   coating a sealant material at edges of the cover plate, mixing the fluorescent material with a desiccant, and coating the fluorescent material and the desiccant mixed with each other on the cover plate inside the sealant material;
   bonding the cover plate with the base substrate; and
   solidifying the sealant material and the desiccant to form a sealant and the filling layer.

10. The preparation method according to claim 9, further comprising: selecting a light-emitting material for forming the organic light-emitting element and the fluorescent material included in the encapsulation structure so that compound light of the first light and the second light is white light.

11. The preparation method according to claim 9, wherein the fluorescent material comprises a first fluorescent material and a second fluorescent material, and the first fluorescent material and the second fluorescent material are excited by the first light to respectively generate the second light and a third light.

12. The preparation method according to claim 11, further comprising: selecting a light-emitting material for forming the organic light-emitting element and the fluorescent material and the second fluorescent material included in the encapsulation structure so that compound light of the first light, the second light and the third light is white light.

13. The preparation method according to claim 9, wherein the encapsulation structure further comprises an inorganic protection layer provided between the filling layer and the organic light-emitting element.

14. The preparation method according to claim 13, wherein the sealant surrounds the organic light-emitting element, the filling layer and the inorganic protection layer, and an end of the inorganic protection layer contacts an inner wall, facing the organic light-emitting element, of the sealant.

* * * * *